United States Patent
Kempf et al.

(10) Patent No.: US 9,606,200 B2
(45) Date of Patent: Mar. 28, 2017

(54) SAMPLE-PREPARATION METHOD TO MANIPULATE NUCLEAR SPIN-RELAXATION TIMES, INCLUDING TO FACILITATE ULTRALOW TEMPERATURE HYPERPOLARIZATION

(71) Applicants: Bruker Biospin Corporation, Billerica, MA (US); Millikelvin Technologies LLC, Braintree, MA (US)

(72) Inventors: James G. Kempf, Arlington, MA (US); Neal Kalechofsky, Stow, MA (US); Melanie Rosay, Bedford, MA (US)

(73) Assignees: Bruker Biospin Corporation, Billerica, MA (US); Millikelvin Technologies LLC, Braintree, MA (US)

( * ) Notice: Subject to any disclaimer, the term of this patent is extended or adjusted under 35 U.S.C. 154(b) by 563 days.

(21) Appl. No.: 14/161,172

(22) Filed: Jan. 22, 2014

(65) Prior Publication Data
US 2015/0061666 A1 Mar. 5, 2015

Related U.S. Application Data

(60) Provisional application No. 61/870,429, filed on Aug. 27, 2013.

(51) Int. Cl.
*G01V 3/00* (2006.01)
*G01R 33/31* (2006.01)
*G01R 33/28* (2006.01)

(52) U.S. Cl.
CPC .......... *G01R 33/31* (2013.01); *G01R 33/282* (2013.01)

(58) Field of Classification Search
USPC ........................................ 324/307
See application file for complete search history.

(56) References Cited

U.S. PATENT DOCUMENTS

| | | | | |
|---|---|---|---|---|
| 2005/0233470 | A1* | 10/2005 | Clark | G01N 24/088 436/173 |
| 2008/0242974 | A1* | 10/2008 | Urbahn | F25B 9/14 600/420 |

(Continued)

OTHER PUBLICATIONS

Panesar, et al., "Thermal history effects and methyl tunneling dynamics in a supramolecular complex of calixarene and para-xylene", The Journal of Chemical Physics, 128, 144512, (2008).

*Primary Examiner* — Rodney Fuller
(74) *Attorney, Agent, or Firm* — O'Shea Getz P.C.

(57) ABSTRACT

A method of providing a material sample in a state favorable to retaining spin polarization includes cooling a material sample from a temperature above a freezing point of the material sample down to a second temperature below the freezing point of the material sample; maintaining the sample at about the second temperature for a period of about several hours; and reducing temperature of the material sample to a third temperature lower than the second temperature to provide the material sample in a state favorable to retaining spin polarization, where the steps of cooling, maintaining and reducing are performed in the absence of an adulterant material. The method of providing a sample of pyruvic acid in a state favorable to retaining spin polarization may include cooling the sample of pyruvic acid in the absence of an adulterant material from a temperature above a freezing point of the sample of pyruvic acid down to less than about 200 Kelvin to provide the sample.

35 Claims, 6 Drawing Sheets

(56) References Cited

U.S. PATENT DOCUMENTS

| | | | |
|---|---|---|---|
| 2009/0016964 A1 | 1/2009 | Kalechofsky et al. | |
| 2010/0158810 A1* | 6/2010 | Lisitza | A61K 49/10 424/9.3 |
| 2010/0196283 A1* | 8/2010 | Lerche | A61K 49/10 424/9.36 |
| 2011/0008261 A1* | 1/2011 | Lerche | A61K 49/10 424/9.3 |
| 2011/0062392 A1 | 3/2011 | Kalechofsky et al. | |
| 2011/0086995 A1* | 4/2011 | Castillo Martinez | C07C 275/20 526/285 |
| 2011/0243855 A1* | 10/2011 | Gisselsson | A61K 49/10 424/9.3 |
| 2014/0123681 A1* | 5/2014 | Urbahn | F25B 21/00 62/3.1 |
| 2014/0125334 A1* | 5/2014 | Owers-Bradley | G01R 33/282 324/309 |
| 2014/0223923 A1* | 8/2014 | Kalechofsky | A61K 49/10 62/3.1 |
| 2016/0033590 A1* | 2/2016 | Eichhorn | G01R 33/282 324/318 |

\* cited by examiner

SAMPLE-PREPARATION METHOD TO MANIPULATE NUCLEAR SPIN-RELAXATION TIMES, INCLUDING TO FACILITATE ULTRALOW TEMPERATURE HYPERPOLARIZATION

PRIORITY INFORMATION

This patent application claims priority from U.S. provisional patent application Ser. No. 61/870,429 filed Aug. 27, 2013, which is hereby incorporated by reference.

FIELD OF TECHNOLOGY

The present disclosure relates to the field of nuclear magnetic resonance (NMR), and in particular to the generation of solid- or frozen-state samples containing hyperpolarized nuclear spins for subsequent utilization in either NMR spectroscopy or magnetic resonance imaging (MRI) of the sample in the solid or frozen state, or upon melting to the liquid state, or upon dissolution to a solution state, or upon sublimation or other conversion to a gas. An aspect of the present disclosure includes preparing samples in a physical state that is favorable for subsequent production and/or maintenance of nuclear spin polarization.

RELATED ART

A hyperpolarized nuclear spin system is one in which the nuclear magnetic moments of the sample are more strongly aligned with an external magnetic field ($B_0$) than in the Boltzmann thermal-equilibrium state for given temperature (T) and $B_0$. Such samples can provide correspondingly large signals in NMR, MRI, magnetic resonance spectroscopy (MRS), or MRS imaging (MRSI). Molecular carriers of nuclear hyperpolarization are thus highly valued as high-sensitivity probes for imaging or spectroscopy.

U.S. Patent Application Publications US2009/0016964 and US2011/0062392, both incorporated herein by reference, describe a process to generate hyperpolarization for use at moderate temperatures, by first polarizing the sample at ultra-low temperature (ULT), for example from tens to hundreds of millikelvin (mK) and high field (e.g., $B_0 > 5$ T). This relies on the fact that the usual Boltzmann polarization from ULT and high-field conditions becomes hyperpolarization if transferred to higher T and/or lower $B_0$.

With appropriate handling and environmental control, it is possible to either immediately exploit ULT-generated hyperpolarization for imaging or spectroscopy, or instead, to store it for later use. Storage times in excess of hours are of particular interest to enable remote distribution of hyperpolarized consumables from off-site production facilities to end users. For example, hyperpolarized imaging agents with adequate spin-polarization lifetimes may be transported to hospitals and imaging centers within the radius of a single production site.

In all steps leading to ULT-derived hyperpolarized products, the critical timescale is $T_1(B_0,T)$. It defines the rate at which nuclear spins approach the Boltzmann condition for a given $B_0$ and T, according to:

$$P(t,B_0,T) = (P_\infty (P_\infty - P_0) \exp[-t/T_1(B_0,T)]),  \quad (\text{EQ. 1})$$

where $P_0$ is the starting value of polarization at time $t=0$, and $P_\infty$ is the ultimate, equilibrium value reached as $t \to \infty$. The latter varies between 0 and 1, depending on $B_0$, T and the particular nuclear isotope involved. Traditional NMR/MRI/MRS/MRSI measure very weak signals from spins with Boltzmann polarizations of the order $P \sim 10^{-5}$ to $10^{-6}$. In contrast, with hyperpolarized nuclear spins, dramatically larger signals are available due to large P values, which may even approach 1.

Figure 1:
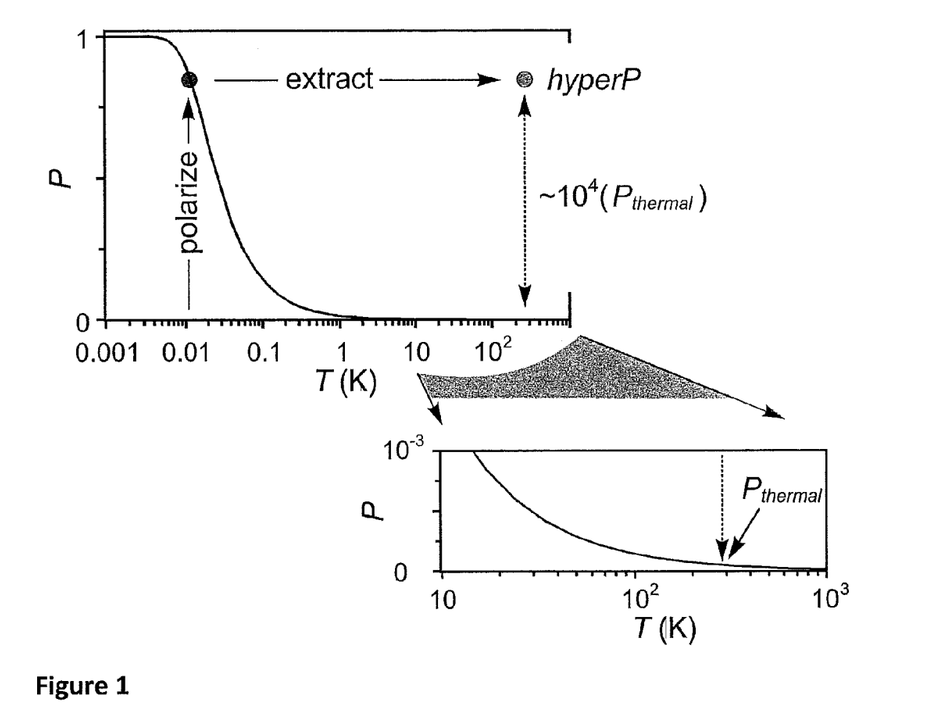

FIG. 1 illustrates a schematic process to generate hyperpolarization from thermal, Boltzmann polarization at ULT and high field. The curve plots the parameter $P_\infty$ from EQ. 1 versus T in the example of $^1H$ nuclei at $B_0=14$ T. For a sample held at tens of mK for sufficient time, P approaches perfection, $P \to (P_\infty \sim 1)$. When P is sufficiently large, altering conditions to higher T (and/or lower $B_0$) extracts and converts it to hyperpolarization (hyperP) at the target $B_0/T$ condition. For a destination near room or body temperatures (lower inset), ULT-derived polarization may be about $10^4$-$10^5$ times the normal thermal value. The generation of hyperpolarization in this manner requires preservation of the ULT-derived quantity through its transfer to moderate conditions (a lower ratio, $B_0/T$). This requires that the change is faster than the time required for the sample to re-equilibrate to the new conditions.

The role of $T_1$ in the ULT approach to hyperpolarization is first apparent when aiming for values of P near unity. That is possible by maintaining the sample in 'ULT-production' conditions over a time on the order of $T_{1,ULT}$, such that P approaches $P_{\infty,ULT}$. Here, 'sufficient' simply means long enough to yield P so large that it can be converted to useful hyperpolarization after extraction to moderate conditions. Such extraction incurs losses, which is the next variety of $T_1$ concern. As $B_0/T$ drops during extraction, spins begin to equilibrate to a new $P_\infty < P_{\infty,ULT}$ corresponding to those more moderate conditions. These equilibration losses are also governed by EQ. 1, but with new $T_1$ values for the $B_0$ and T experienced during extraction. Following this, extracted hyperpolarized materials may be temporarily stored at sufficient $B_0/T$ to slow equilibration losses, i.e., by maintaining $B_0/T$ to provide relatively long $T_1$ and hence sufficiently long storage times. Finally, all the above processes occur with the sample in the solid or frozen state (non-solid examples are possible, e.g., when polarizing helium nuclei). Although subsequent solid- or frozen-state applications are readily envisioned, typical final-stage use will entail either melting, dissolution or sublimation of the hyperpolarized sample for liquid- or solution-state applications in spectroscopy and imaging. Here again, $T_1$ and EQ. (1) determine losses, both in the process of converting from the solid or frozen state, and also thereafter, during the time period for use of the hyperpolarization.

Figure 2A:
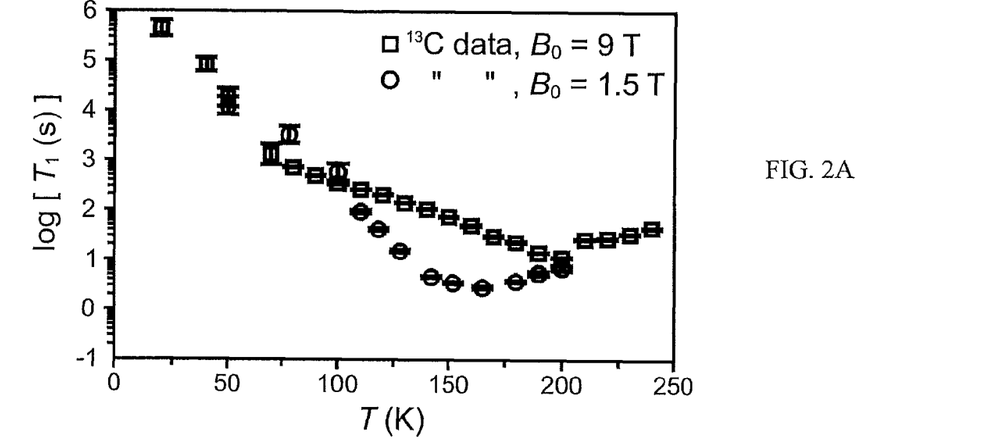
FIGS. 2A and 2B illustrate $T_1$ profiles of pyruvic acid at the $^{13}C_1$ site (carboxylic acid) and $^1$H sites, respectively.
Figure 2B:
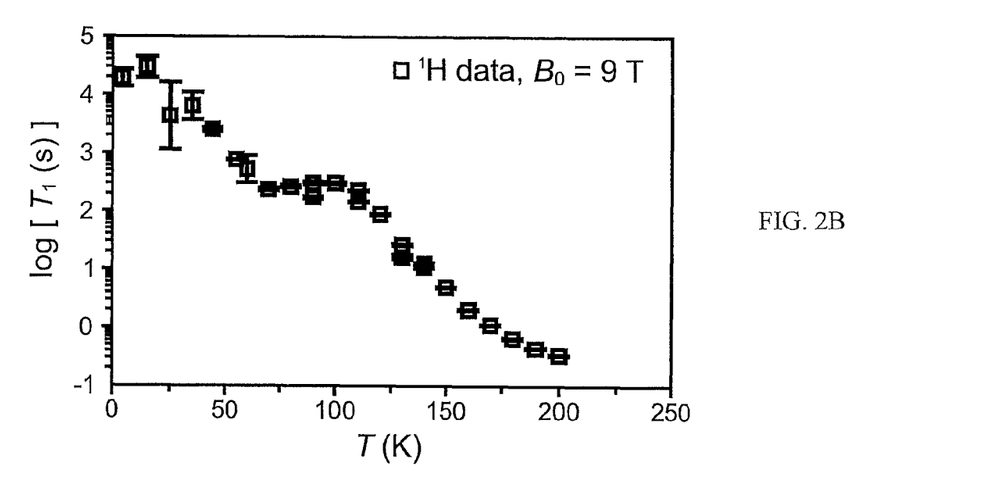

Thus, successful production of a hyperpolarized product requires a favorable profile of $T_1$ vs. both $B_0$ and T. The series of events just described (i.e., ULT production, extraction/conversion, storage/transport, and use/application) takes a sample from conditions near to or less than hundreds of mK or even just a few Kelvin, and then up to the vicinity of room T. Corresponding profiles of $T_1$ through such temperatures are shown in FIGS. 2A and 2B for $^{13}C$ and $^1H$ nuclei of neat pyruvic acid. A key feature is apparent in FIG. 2A, showing a 'valley profile' of $^{13}C$ data vs. T at $B_0=1.5$ T (gray open circles in FIG. 2A). The valley appears as a $T_1$ minimum near 150-175 K. This is often referred to as the 'valley of death', because its orders-of-magnitude shorter $T_1$ (e.g., vs. $T_1$ for T<100 K) can bring a quick end to ULT-generated polarization. That is, sample warming during extraction should avoid spending even fractions of a second near the valley center. Changes in the valley profile with respect to field are most notably characterized by the shifted position of the $T_1$ minimum versus T. For example, FIG. 2A also shows $^{13}C$ data at $B_0=9$ T with a valley center at approximately 200 K instead of the noted 150-175 K observed at 1.5 T. In FIG. 2B, similar behavior for $^1$H relaxation is shown from data obtained at $B_0$=9 T only, although note that this omits $T_1$ values from above the ~200 K 'turning point' in the valley profile for this field.

Techniques of changing the $T_1$ of a material in the solid or frozen state are known in the art. However, these techniques generally involve adding an adulterant to the material to reduce the relaxation time. Typical examples of such adulterants would be uniform dispersions of lanthanide atoms within an otherwise pure molecular substance or aqueous solution thereof, for example, as in the paper by Peat, D. T., Horsewill, A. J., Köckenberger, W., Perez Linde, A. J., Gadian, D. G., and Owers-Bradley, J. R. *Phys. Chem. Chem. Phys.*, 15, 7586 (2013). Such adulterants provide fast relaxing electron spins that interact with and reduce $T_1$ values among nuclear spins of the primary molecular substance. Another example is an adulterant mixture of p-xylene and calixarene molecules, as studied by Panesar, K. S.; Horsewill, A. J.; Cuda, F.; Carravetta, M.; Mamone, S.; Danquigny, A.; Grossel, M. C.; Levitt, M. H. *J. Chem. Phys.*, 128, (2008). There, the pair of calixarenes forms a molecular cage about p-xylene. This design modifies structural organization and, therefore, $T_1$ behavior in one or both of the partner molecules.

A problem with such prior art approaches is that the adulterants are often contraindicated for in vivo applications, particularly in humans. The adulterant may be, and typically is toxic. Furthermore, even an apparently nontoxic species may complicate drug approval when the substance is intended for administration to human subjects. Thus, adulterants in existing hyperpolarization systems for NMR/MRI/MRS/MRSI are filtered or highly diluted prior to application in vivo, for example, as in the paper by Ardenkjaer-Larsen, J. H.; Leach, A. M.; Clarke, N.; Urbahnb, J.; Anderson, D.; Skloss, T. W. *NMR in Biomedicine*, 24, 928 (2011).

Another problem with $T_1$-impacting adulterants is that, when present to enhance the rate at which hyperpolarization is generated, often they also unfortunately increase the rate at which that hyperpolarization is lost upon removal from hyperpolarizing conditions. This is especially problematic in the art when electron-spin bearing adulterants are used, as they impact $T_1$ by a nearly uniform factor along its entire temperature profile. This is not always desirable, for example, when very long $T_1$ values are required to enable storage and/or shipment of a hyperpolarized material, as described above.

There is a need for a technique of sample preparation to manipulate nuclear spin-relaxation times in order to facilitate ultralow temperature hyperpolarization that does not require an adulterant.

SUMMARY OF THE INVENTION

A method of providing a material sample in a state favorable to retaining spin polarization includes cooling the material sample from a temperature above a freezing point of the material sample down to a second temperature below the freezing point of the material sample; maintaining the sample at about the second temperature for a period of about several hours; and reducing the temperature of the material sample to a third temperature lower than the second temperature to provide the material sample in a state favorable to retaining spin polarization, where the steps of cooling, maintaining and reducing are performed in the absence of an adulterant material.

The material sample may comprise pyruvic acid, acetic acid, or a molecule containing one or more methyl groups and/or carboxylic acid groups, and the material sample is isotopically enhanced by substituting one or more of its atomic sites with at least one of 129Xe, 13C, 15N, 1H, 2H, 31P, 19F and 29Si.

According to another aspect, a method of providing a sample of pyruvic acid in a state favorable to retaining spin polarization comprises cooling a sample of pyruvic acid from a temperature above a freezing point of the sample of pyruvic acid down to about 230 Kelvin; maintaining the sample at about 230 Kelvin for a period of about 3-4 hours; and reducing the temperature of the sample of pyruvic acid to about 200 Kelvin.

The step of reducing may be performed at a rate of about 0.1 Kelvin per minute. In another embodiment, the step of reducing is performed at a rate of about 0.3 Kelvin per minute. In yet another embodiment the step of reducing is performed at a rate of at least about 0.5 Kelvin per minute. In still yet another embodiment the step of reducing is performed at a rate less than about 0.1 Kelvin per minute.

In one embodiment the step of cooling is performed at a rate of at least about 0.3 Kelvin per minute, and in another embodiment the step of cooling is performed at a rate of at least about 1.0 Kelvin per minute.

In yet another embodiment, a method of providing a sample of pyruvic acid in a state favorable to retaining spin polarization includes cooling a sample of pyruvic acid from a temperature above of a freezing point of the sample down to less than about 200 Kelvin; warming the sample to a temperature of about 230 Kelvin; maintaining the sample at about 230 Kelvin for a period of about 3-4 hours; and reducing temperature of the sample to about 200 Kelvin. The step of reducing may be performed for example at a rate of about 0.5 Kelvin per minute, or at a rate of about 0.1 Kelvin per minute. Similarly, the step of reducing may be performed at a rate of at least about 0.5 Kelvin per minute, alternatively at a rate less than about 0.1 Kelvin per minute.

In still yet another embodiment, a method of providing a sample of a material comprising a molecule containing at least one methyl group and/or carboxylic acids in a state favorable to retaining spin polarization includes cooling that sample from a temperature above a freezing point of the sample down to about 220-250 Kelvin; maintaining the sample at about 220-250 Kelvin for a period of at least about two hours; and reducing temperature of the sample to about 200 Kelvin. The steps of cooling, maintaining and reducing may be performed in the absence of an adulterant. The sample may be selected from one of pyruvic acid, acetic acid, or a molecule containing one or more methyl groups and/or carboxylic acid groups. The material sample may be isotopically enhanced by substituting one or more of its atomic sites with at least one of 129Xe, 13C, 15N, 1H, 2H, 31P, 19F and 29Si.

According to a further embodiment, a method of providing a sample of pyruvic acid in a state favorable to rapid attainment of high spin polarization includes cooling a sample of pyruvic acid in the absence of an adulterant material at a rate of at least about one Kelvin per minute from a temperature above a freezing point of the sample of pyruvic acid down to less than about 200 Kelvin to provide the sample.

In another embodiment, a method of providing a sample of pyruvic acid in a state favorable to rapid attainment of high spin polarization includes cooling a sample of pyruvic acid at a rate of at least about one Kelvin per minute from a temperature above a freezing point of the sample of pyruvic acid down to about 265 Kelvin; maintaining the sample at about 265 Kelvin for a period of about 1 hour; and reducing the temperature of the sample of pyruvic acid to about 200 Kelvin.

In still another embodiment, a method of providing a sample in a state favorable to rapid attainment of high spin polarization includes cooling the sample at a rate of at least about one Kelvin per minute from a temperature above a freezing point of the sample of pyruvic acid down to about 265 Kelvin; maintaining the sample at about 265 Kelvin for a period of about 1 hour; and reducing temperature of the sample to about 200 Kelvin, wherein the steps of cooling, maintaining and reducing are performed in the absence of an adulterant material. The sample may be selected from one of pyruvic acid, acetic acid, or a molecule containing one or more methyl groups and/or carboxylic acid groups, and the material sample may be isotopically enhanced by substituting one or more of its atomic sites with at least one of 129Xe, 13C, 15N, 1H, 2H, 31P, 19F and 29Si.

Sample handling methods of aspects of the present invention, by which the $T_1$ versus temperature curve of a material is shifted along its temperature profile, do not rely on adulterants. Shifting of the valley profile is preferred over the uniform reduction in rates noted to occur with many adulterant species, because shifting does not reduce the minimum or limiting $T_1$ values vs. temperature. The applicants also note that the advantages of the methods taught here, while not relying on adulterants, may survive their presence should one desire to additionally incorporate them for some complementary or secondary benefit.

These and other objects, features and advantages of the present invention will become apparent in light of the detailed description of the embodiments thereof, as illustrated in the accompanying drawings. In the figures, like reference numerals designate corresponding parts or steps.

DESCRIPTION OF THE DRAWINGS

The invention can be better understood with reference to the following drawings and descriptions. The components in the figures are not necessarily to scale, instead emphasis being placed on illustrating the principles of the invention. Moreover, in the figures like reference numerals designate corresponding parts. In the drawings:

FIG. 1 illustrates a schematic process to generate hyperpolarization from thermal, Boltzmann polarization at ULT and high field. The curve plots the parameter $P_\infty$ from EQ. 1 vs. T in the example of $^1$H nuclei at $B_0$=14 T. For a sample held at tens of mK for sufficient time, P approaches perfection, P→($P_\infty$~1). When P is sufficiently large, altering conditions to higher T (and/or lower $B_0$) extracts and converts it to hyperpolarization (hyperP) at the target $B_0$/T condition. For a destination near room or body temperatures (lower inset), ULT-derived polarization may be ~$10^4$-$10^5$ times the normal thermal value.

In FIG. 2A the $^{13}$C data at $B_0$=1.5 T depicts the 'valley' profile described in the text. Field-dependent differences are most notably characterized by the shifted position of the $T_1$ minimum versus T. In FIG. 2B, similar behavior for $^1$H relaxation is shown (9 T only), although without data from above the ~200 K 'turning point' in the valley profile for this field.

FIGS. 3A and 3B illustrate annealing effects on $T_1$ profiles of pyruvic acid at (a) the $^{13}C_1$ site and (b) $^1$H sites, respectively. Each plot shows data (■) from a rapidly cooled sample (starting above the 285 K melting point and dropping to ≤200 K in ~20 min). This was collected over 7-230 K using vaporized l-$N_2$ or l-He to achieve T>80 or <80 K, respectively. Later, these results were reproduced (○) over about 80-200 K using a freshly prepared sample with equivalent thermal treatment. After a second such rapid freeze and cool, that same sample was warmed to about 280 K, then rapidly cooled to 200 K. After holding there for about 24 hours, this sample then exhibited the dramatically altered $T_1$ profiles (⊡) shown in (a) and (b). Finally, the same sample was made to revert to the non-annealed form (△) by melting it and then again rapidly cooling to <200K and on to 85 K. Subsequently (data not shown), we demonstrated the return of this sample to $T_1$ values commensurate with the annealed form by increasing T to about 230 K, holding for about 4 hours and then rapidly dropping to ≤200 K.

FIG. 4B also shows the subsequent drop and return of the sample temperature to about 200 K.

DETAILED DESCRIPTION OF THE INVENTION

Recently, the applicants have shown the valley illustrated in FIGS. 2A and 2B may be crossed successfully, without excessive $T_1$ losses. Keys are to reduce/minimize exposure to low field, where the valley center both deepens and shifts to lower T, and to reduce/minimize exposure to the valley center, by crossing to the high-T, rising-$T_1$ side of the valley in a timely manner when melting, dissolving, or otherwise warming the hyperpolarized sample.

A third critical feature of the valley profile is that it must be centered to allow useful time for storage and/or transport of hyperpolarized material. Herein we disclose sample-handling protocols to select a center position. This also establishes a corresponding rising-$T_1$ profile on the low-T (lefthand) side. For most samples, the timing criteria for storage/transport steps will be set by that low-T rise. For example, according to FIG. 2A, hyperpolarization on the $^{13}C_1$ site of pyruvic acid may be stored for only about an hour ($T_1$~$10^3$ s) if held near 1.5 T and 100K. In contrast, at the same field, but 50 K, the timescale increases ~10-fold. This adds dramatically to the utility of hyperpolarized materials, both removing urgency in applications and enabling off-site production. For example, that 10-fold increase can enable intra- and even inter-city transport, to sites that would otherwise require an on-site polarizer, expertise in its use, plus support and service from the manufacturer.

Our innovations to manipulate $T_1$ map new information onto earlier well-known aspects of $T_1(B_0,T)$. Prior art techniques, such as those disclosed in U.S. Patent Application Publications US2009/0016964 and US2011/0062392, to utilize ULT-derived hyperpolarization accounted for traditional factors in field and temperature profiles of $T_1$. Profiles like those in FIGS. 2A and 2B are a property both of the molecule bearing the spins and of its environment. The latter can include the sample pH and the type or fractional content of solvent or co-solute, if any, with the sample. Even seemingly dilute gases, particularly paramagnetic species such as $O_2$, are well-known to significantly impact $T_1(B_0,T)$. See for example, Krjukov, E. V.; O'Neill, J. D.; Owers-Bradley, J. R. *J. Low Temp. Phys.*, 140, 397, (2005). The same is true of paramagnetic metals or molecular radicals present (intentionally or not) with or within the sample. See for example the papers by (i) Wickramasinghe, N. P.; Shaibat, M.; Ishii, Y. *J. Am. Chem. Soc.*, 127, 5796, (2005); (ii) Gadian, D. G.; Panesar, K. S.; Linde, A. J. P.; Horsewill, A. J.; Kockenberger, W.; Owers-Bradley, J. R. *Physical Chemistry Chemical Physics*, 14, 5397, (2012); and (iii) Peat, D. T.; Horsewill, A. J.; Kockenberger, W.; Linde, A. J. P.; Gadian, D. G.; Owers-Bradley, J. R. *Physical Chemistry Chemical Physics*, 15, 7586, (2013).

Less well known is the fact that the thermal history of a sample, alone and independent of other noted factors, can alter $T_1$ profiles vs. $B_0$ and T. Recently, in the paper by Panesar, K. S.; Horsewill, A. J.; Cuda, F.; Carravetta, M.; Mamone, S.; Danquigny, A.; Grossel, M. C.; Levitt, M. H. *J. Chem. Phys.*, 128, (2008), this was shown to be the case in a composite system of two molecular species: p-xylene in a 1:2 ratio with the bowl-shaped calixarene molecule. The particular calixarene studied was isopropylcalix[4]arene, and p-xylene=paraxylene, also known as 1,4-dimethylxylene. This system may be prepared such that two calixarenes assemble as inverted bowls encapsulating a single p-xylene. Interestingly, the degree of order in such self-assembled aggregates depended on the rapidity of cooling an already solid-state sample down to cryogenic temperatures. Especially striking, was the authors' finding that the 'thermal history' through such cooling drastically altered the $T_1$ of protons in the complex. For example, a slow-cooled (i.e., annealed) sample brought from near room T (about 290 K) and lowered at 0.3 K./min to cryogenic T (i.e., ≤~100 K) exhibited $T_1$ values about $10^1$-$10^2$)-fold larger than did the identical sample after instead cooling over just minutes through the same T range. These large factors of change were apparent at cryogenic temperatures of about 6-80 K at a reported field of $B_0$=0.7 T.

Figure 3A:
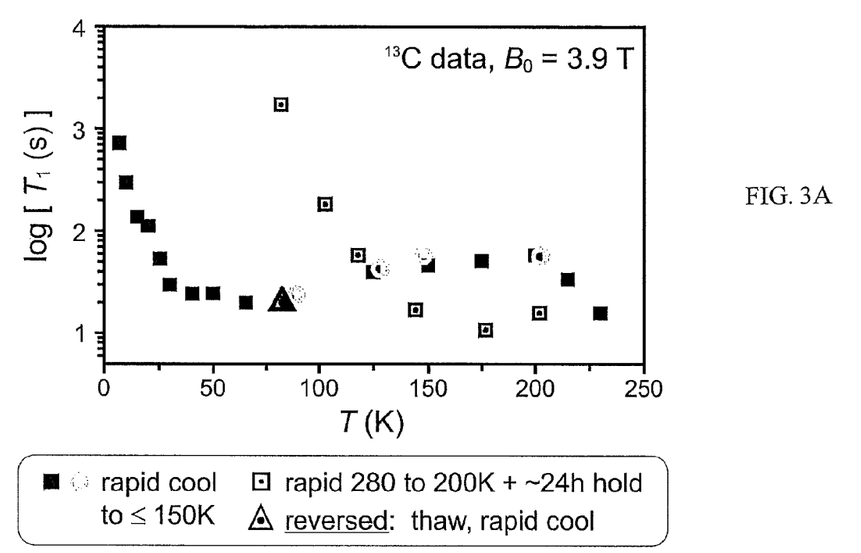
Figure 3B:
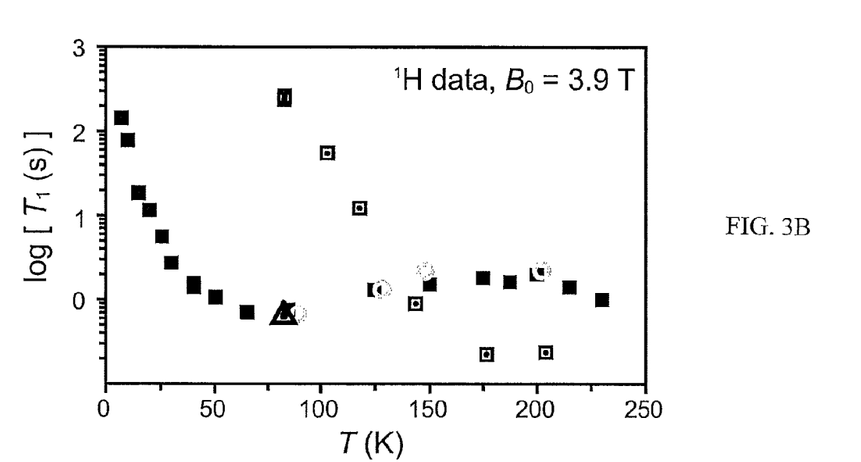

Here, we present a surprising new finding that thermal history can also greatly alter $T_1(B_0,T)$ for a sample composed of a single molecule (here, neat pyruvic acid). In particular, we show that the thermal history may be used to position the valley center at either ~65 or ~175 K for both $^1H$ and $^{13}C_1$ $T_1$ profiles. See FIGS. 3A and 3B which illustrate plots of annealing effects on $T_1$ profiles of pyruvic acid at (a) the $^{13}C_1$ site and (b) $^1H$ sites. Each plot shows data (■) from a rapidly cooled sample (starting above the 285 K melting point and dropping to ≤200 K in about 20 min) This was collected over 7-230 K using vaporized l-$N_2$ or l-He to achieve T>80 or <80 K, respectively. Later, these results were reproduced (○) over about 80 to 200 K using a freshly prepared sample with equivalent thermal treatment. After a second such rapid freeze and cool, that same sample was warmed to about 280 K, then rapidly cooled to 200 K. After holding there for about 24 hours, this sample then exhibited the dramatically altered $T_1$ profiles (▫) shown in FIGS. 3A and 3B. Finally, the same sample was made to revert to the non-annealed form (△) by melting it and then again rapidly cooling to <200K and on to 85 K. Subsequently, we demonstrated the return of this sample to $T_1$ values commensurate with the annealed form by increasing to T about 230 K, holding for about 4 hours and then rapidly dropping to ≤200 K. The changes induced by the various noted temperature-handling protocols are most critically distinguished by the repositioning of the center of the $T_1$ valley. Centering at the higher T resulted from conditions that we determined to yield a properly annealed sample. The noted T values at the valley center correspond to measurements at $B_0$=3.9 T (FIGS. 3A and 3B). Both high- and low-T centers will shift for different $B_0$, but are expected to remain distinct in all high-field conditions (≥~1 T). We provide several preferred embodiments of a method to achieve that state, as well as embodiments to yield the non-annealed form.

In a preferred application, the methods taught here select the $T_1$ profile of a material to enhance its use in hyperpolarized NMR/MRI/MRS/MRSI protocols. For example, in one embodiment, the material includes at least one methyl group and/or one carboxylic acid group, and is a liquid at room temperature. Pyruvic acid is one example of such a material. Finally, the material may have at least one of its atoms isotopically enriched to improve its usage in NMR/MRI/MRS/MRSI protocols. An example of this would be 1-$^{13}C$ pyruvic acid (also known as $^{13}C_1$ pyruvic acid).

The methods taught by this application are sample handling protocols for generation, extraction, storage/transport and application of ULT-derived hyperpolarization. Success there, perhaps especially in storage and transport, depends critically on values of $T_1$. For example, data from non-annealed samples in FIGS. 3A and 3B (e.g., ■ and ○) reveals a state that would severely challenge feasibility for storage and transport. Spin-polarization lifetimes there would limit the available timescale to an hour or less, even near 4-5 K l-He temperatures and $B_0$ about 4 T. In contrast, the annealed form (see FIGS. 2A, 2B and data marked by with ▫ FIGS. 3A and 3B) provides comparable lifetimes near more-convenient and less-costly l-$N_2$ temperatures and for $B_0$ of just 1.5 T. Furthermore, this state provides >$10^2$-fold longer $T_1$ at T<~10 K. That can enable transport over the scale of days, substantially increasing the radius from production site to customer facilities.

Surprise in our findings occurred in two aspects. First, unlike the 2:1 calixarene:p-xylene complex from the prior art described above, neat pyruvic acid does not require self-assembly of distinct molecular building blocks. Thus, annealing would be expected to have only more subtle impacts on the intra- and inter-molecular interactions that determine $T_1$ in the frozen material. Secondly, we found that even though pyruvic acid is a liquid at room T, a critical annealing step occurs not in the vicinity of its freezing point (about 285 K), but rather in a transition we discovered at about 50-80 K below the freezing point.

The applicants have further discovered that, as shown in FIGS. 3A and 3B, one may cycle in or out of the annealed state without even resorting to melting and re-freezing. For example, an annealed state may be generated by warming a non-annealed sample from ≤~200 K to about 230 K, holding it there for about 3-4 hours and then cooling again to ≤~200 K in a manner commensurate with annealing protocols from that temperature. Similarly, a non-annealed state may be generated by warming an annealed sample from ≤~200 K to ~230-280 K, holding it there for about 2-4 hours and then cooling again to ≤~200 K in a manner commensurate with the rapid cooling of non-annealed sample production.

Figure 4A:
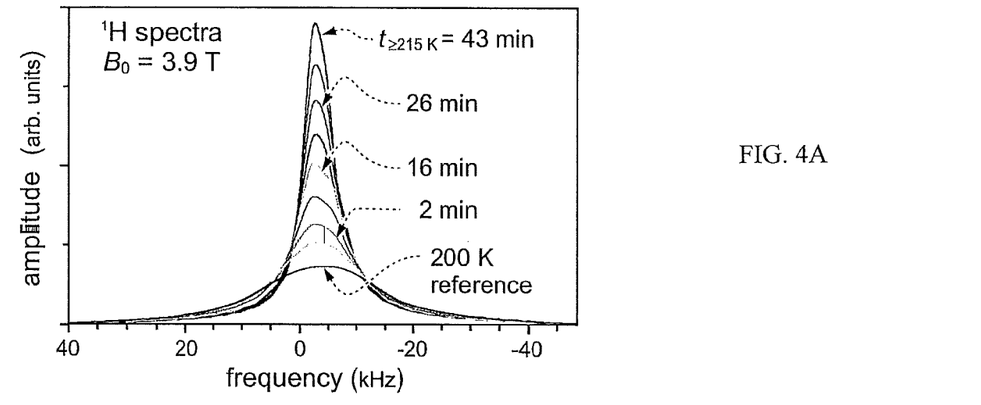
FIG. 4A shows spectra collected during the warming of a non-annealed sample from 200 to 230 K.
Figure 4B:
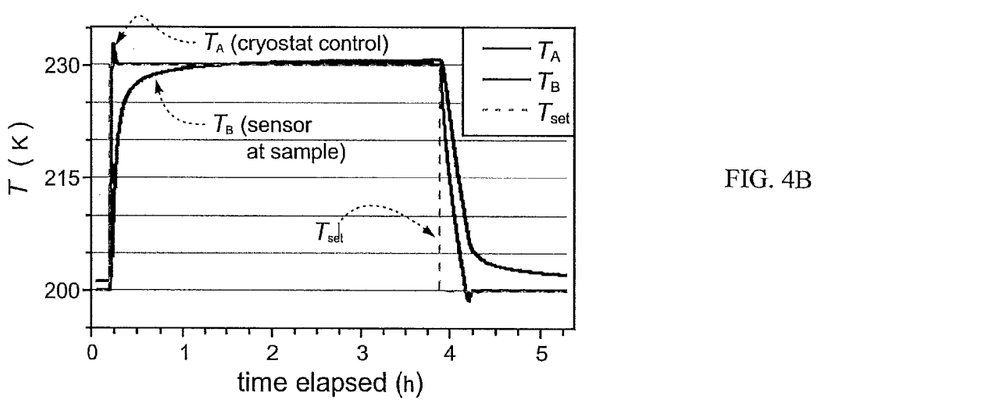
FIG. 4B illustrates a corresponding detailed T path, wherein as T rises above 200 K, the $^1$H lineshape narrows from about 24.3 to about 6.9 kHz full width at half maximum (FWHM).
Figure 4C:
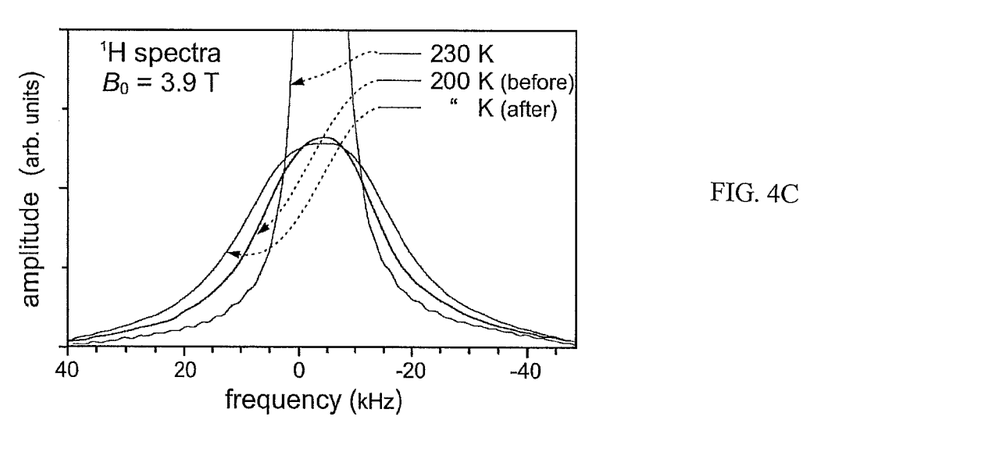
FIG. 4C shows that returning to 200 K yielded a noticeably broader line shape (about 30.5 kHz FWHM) than observed before the rise and fall in T.

Another key feature of the turning point located at about 200-230 K is the variation of the $^1H$ NMR lineshape through this region. FIG. 4A shows spectra collected during the just-noted example of warming a non-annealed sample from 200 to 230 K. FIG. 4B illustrates a corresponding detailed T path. As the sample T rose above 200 K, the $^1H$ lineshape unmistakably narrowed from about 24.3 to about 6.9 kHz full width at half maximum (FWHM). FIG. 4C shows that returning to 200 K yielded a noticeably broader lineshape (about 30.5 kHz FWHM) than observed before the rise and fall in T. The FWHM values reported fits to 50/50 mixed Gaussian/Lorentzian lineshape at 200 K before the rise to 230 K and 70% Gaussian after. These yielded superior fits versus other fractional combinations. At 230 K, a pure Gaussian was better. In all cases, uncertainties in the FWHM were no more than ±0.04 kHz.) For clarification, we note that the spectra of FIG. 4A also exhibit increasing area under the curve as time passed with rising T. This effect is not directly pertinent to present discussion. It merely reflects the fact that all spectra were collected with eight signal-averaged scans at fixed recycle delay of 1 second, which was implemented after destroying $^1H$ magnetization. This delay is less $T_1$ for all temperatures and sample conditions in this region. Thus, incomplete recovery $^1H$ magnetization between scans for a single spectrum affected its area. Furthermore, because $T_1$ varied with rising T this effect had variable impact from spectrum to spectrum.

The observations on lineshape variation with sample T presented in FIGS. 4A and 4C provided our initial clue to the significance of the about 200-230 K regime for pyruvic acid. Furthermore, an advantage of this finding is that the changes in lineshape can serve as a diagnostic for screening other molecules that may exhibit similar behavior over their own characteristic regime. That is, the clear spectral transition observed pinpoints the T region that is critical for switching between annealed and non-annealed states, and thereby selecting between dramatically distinct $T_1$ profiles.

In addition, at temperatures slightly below the annealing range, the lineshape is distinct for the two sample forms, as shown in FIG. 4C. This provides a superior method of determining which $T_1$ profile the sample will exhibit in subsequent use. In contrast, it would take much longer (up to hours, versus seconds or minutes) to determine the sample state by carrying out $T_1$ measurements at lower T or a range of lower T values. Such experiments take much longer than lineshape measurements, even more so as T drops to the left of the $T_1$ valley, where additional cryogen costs are another negative factor. Other alternatives may include measuring the relaxation time ($T_2$) when spins are perpendicular to the direction of $B_0$. However, such experiments would also certainly be longer than simple lineshape measurements, including up to times of similar duration as $T_1$ studies.

In addition, on this point, $^1H$ lineshapes are discussed here because they are more sensitive reporters on the noted sample changes than is the $^{13}C$ lineshape. However, the $^{13}C_1$ lineshape in pyruvic acid also provides responses corresponding to the progressions of FIGS. 4A and 4C, and it or other nuclei present in this or other molecules might also be used to identify the changes. Generally, $^1H$ will be preferred when available, due to its relatively larger signal intensity and shorter $T_1$, relative to nearly all other nucleai with lower gyromagnetic ratio ($\gamma$). Nonetheless, in some cases, nuclei with fairly high $\gamma$ may be preferred, such as $^{19}F$ and $^{31}P$, as these often have lineshapes with high sensitivity to changes in the local environment.

Heat capacity measurements are an additional method by which one can identify the change between the relevant annealed and non-annealed sample types. This may be used both (a) to identify a critical T region during which a transition between states occurs, and (b) to specify the current state of the sample. The suggested applications are thus essentially same as discussed for lineshapes above and in FIGS. 4A-4C. A potential advantage is that heat capacity measurements may be made without the necessity of sophisticated and costly NMR measurement apparatus. This includes in the absence of a magnet, and also removes need of a probe for excitation and detection of NMR signals, and of a spectrometer for signal processing and analysis. This may be useful for quality control in production of samples for ULT hyperpolarization before they are introduced to the polarizer.

Heat capacity is related to the changes in $T_1$ because the latter varies according to molecular motions and other fluctuations at frequencies relevant to nuclear spin transitions. See, for example, the publication by Kempf, J. G.; Loria, J. P. *Cell Biochem. & Biophys.*, 39, 187, (2003). Such fluctuations cause nuclear spin relaxation, including $T_1$ processes. Heat capacity in a solid at constant volume is the derivative with respect to temperature of the internal energy of a system. For example, a molecular solid whose components have a relatively large freedom of motion will have a greater heat capacity than a material whose components have less motional freedom. Because that freedom impacts $T_1$, changes in heat capacity may be used to identify transitions between material states with distinct $T_1$ behavior. Likewise, the heat capacity of a sample can discriminate between states such as those we have termed as the annealed and non-annealed forms of pyruvic acid.

Figure 5:
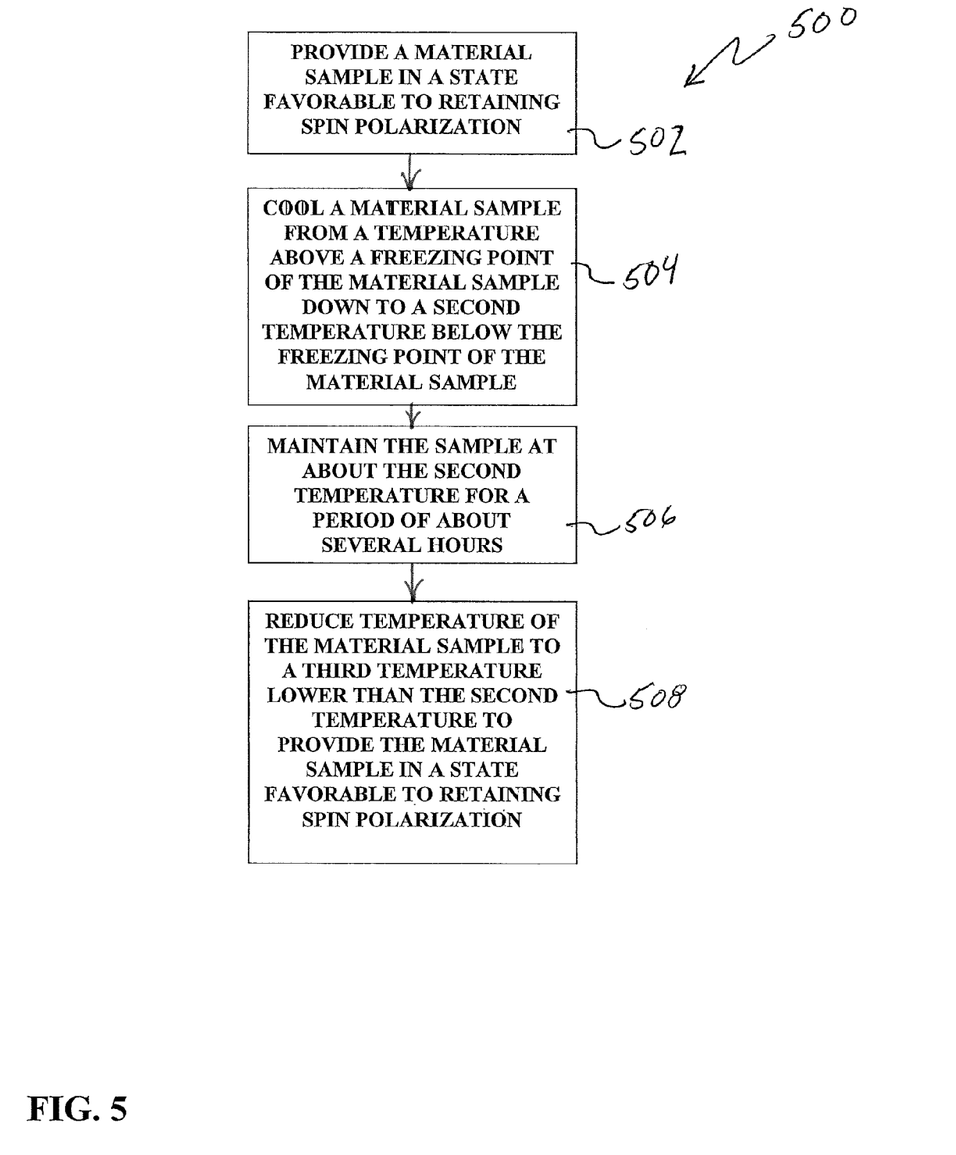
FIG. 5 is a flowchart illustration of a first method of providing a material sample in a state favorable to retaining spin polarization.

FIG. 5 illustrates a first method 500 of providing a material sample in a state favorable to retaining spin polarization. The method step 502 of providing a sample in a state favorable to retaining spin polarization. The sample material may include pyruvic acid, acetic acid, or a molecule containing one or more methyl groups and/or a carboxylic acid group. The sample may be isotopically enhanced by substituting one or more of its atomic sites with at least one of 129Xe, 13C, 15N, 1H, 2H, 31P, 19F and 29Si.

In step 504 the material sample is cooled from a temperature above a freezing point of the material sample down to a second temperature below the freezing point of the material sample. In step 506 the sample is maintained at about the second temperature for a period of about several hours. In step 508 the temperature of the material sample is reduced a third temperature lower than the second temperature to provide the material sample in a state favorable to retaining spin polarization.

In one embodiment for example the second temperature may be about 220-250 K (e.g., about 230 K) and the third temperature may be about 200 K. In addition, in the steps cooling, maintaining and reducing in steps 502, 504 and 506 respectively of FIG. 5 may be performed in the absence of an adulterant material.

The rate of reducing the temperature from the second temperature to the third temperature may be performed at a rate of at least about 0.1 K per minute. In one embodiment the rate may be about 0.5 K per minute.

The step 506 may maintain the sample at the second temperature for at least about two hours (e.g., about 3-4 hours).

Figure 6:
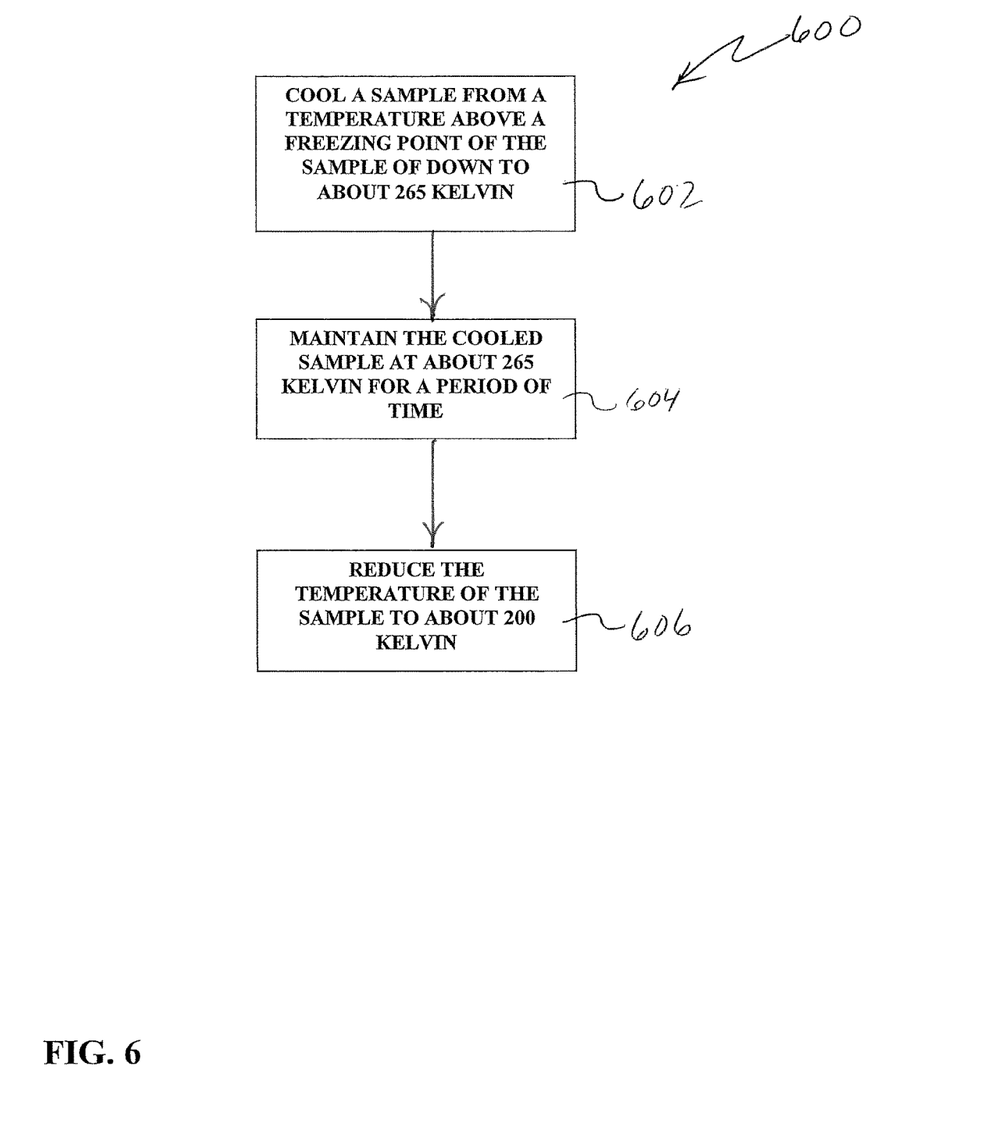
FIG. 6 is a flowchart illustration of a second method of providing a material sample in a state favorable to rapid attainment of high spin polarization.

FIG. 6 illustrates a second method 600 of providing a material sample in a state favorable to rapid attainment of high spin polarization. The method includes providing a material sample in a state favorable to retaining spin polarization by cooling a material sample, in step 602, for example at a rate of at least about one Kelvin per minute from a temperature above a freezing point of the sample of pyruvic acid down to about 265 Kelvin. The method also includes step 604 of maintaining the sample at about 265 Kelvin for a period of time. In step 606, the temperature of the sample material is reduced to about 200 Kelvin.

The steps of cooling 602, maintaining 604 and reducing 606 may be performed in the absence of an adulterant material. The sample may be selected from one of pyruvic acid, acetic acid, or a molecule containing one or more methyl groups and/or a carboxylic acid group. The period of time of maintaining may be greater than about 15 minutes and less than about 48 hours (e.g., about 1-2 hours).

Although the present invention has been illustrated and described with respect to several preferred embodiments thereof, various changes, omissions and additions to the form and detail thereof, may be made therein, without departing from the spirit and scope of the invention.

What is claimed is:

1. A method of providing a material sample in a state favorable to retaining spin polarization, the method comprising:
    cooling a material sample from a temperature above a freezing point of the material sample down to a second temperature below the freezing point of the material sample;
    maintaining the sample at about the second temperature for a period of about several hours; and
    reducing temperature of the material sample to a third temperature lower than the second temperature to provide the material sample in a state favorable to retaining spin polarization,
    where the steps of cooling, maintaining and reducing are performed in the absence of an adulterant material.

2. The method of claim 1, wherein the material sample comprises pyruvic acid.

3. The method of claim 1, wherein the material sample comprises acetic acid.

4. The method of claim 1, wherein the material sample comprises a molecule containing one or more methyl groups.

5. The method of claim 1, wherein the material sample comprises a molecule containing one or more carboxylic acid groups.

6. The method of claim 1, wherein the second temperature is about 50-80 degrees Kelvin below the freezing point of the material sample.

7. A method of providing a sample of pyruvic acid in a state favorable to retaining spin polarization, the method comprising:
    cooling a sample of pyruvic acid from a temperature above a freezing point of the sample of pyruvic acid down to about 230 Kelvin;
    maintaining the sample at about 230 Kelvin for a period of about 3-4 hours; and
    reducing temperature of the sample of pyruvic acid to about 200 Kelvin.

8. The method of claim 7, where the step of reducing is performed at a rate of about 0.5 Kelvin per minute.

9. The method of claim 7, where the step of reducing is performed at a rate of about 0.1 Kelvin per minute.

10. The method of claim 7, where the step of reducing is performed at a rate of at least about 0.5 Kelvin per minute.

11. The method of claim 7, where the step of reducing is performed at a rate less than about 0.1 Kelvin per minute.

12. The method of claim 7, where the step of cooling is performed at a rate of at least about 0.3 Kelvin per minute.

13. The method of claim 7, where the step of cooling is performed at a rate of at least about 1.0 Kelvin per minute.

14. A method of providing a material sample in a state favorable to retaining spin polarization, the method comprising:
    cooling a material sample from a temperature above a freezing point of the sample down to less than about 200 Kelvin;
    warming the sample to a temperature of about 230 Kelvin;
    maintaining the sample at about 230 Kelvin for a period of about 3-4 hours; and
    reducing temperature of the sample to about 200 Kelvin.

15. The method of claim 14, where the step of reducing is performed at a rate of about 0.5 Kelvin per minute.

16. The method of claim 14, where the step of reducing is performed at a rate of about 0.1 Kelvin per minute.

17. The method of claim 14, where the step of reducing is performed at a rate of at least about 0.5 Kelvin per minute.

18. The method of claim 14, where the step of reducing is performed at a rate of at least about 0.1 Kelvin per minute, where the sample is selected from one of pyruvic acid, acetic acid, or a molecule containing one or more methyl groups and/or a carboxylic acid group, and where the sample where is isotopically enhanced by substituting one or more of its atomic sites with at least one of 129Xe, 13C, 15N, 1H, 2H, 31P, 19F and 29Si.

19. The method of claim 14, where the step of cooling is performed at a rate of at least about 0.3 Kelvin per minute.

20. The method of claim 14, where the step of cooling is performed at a rate of at least about 1.0 Kelvin per minute.

21. A method of providing a sample of a material comprising a molecule containing at least one methyl group in a state favorable to retaining spin polarization, the method comprising:
    cooling a sample comprising a molecule containing at least one methyl group from a temperature above a freezing point of the sample down to about 220-250 Kelvin;
    maintaining the sample at about 220-250 Kelvin for a period of at least about two hours; and
    reducing temperature of the sample to about 200 Kelvin.

22. The method of claim 21, wherein the step of cooling is performed at a rate of at least about 0.3 Kelvin per minute, and the steps of cooling, maintaining and reducing are performed in the absence of an adulterant.

23. The method of claim 21, wherein the sample is selected from one of pyruvic acid, acetic acid, or a molecule containing one or more methyl groups and/or a carboxylic acid group.

24. A method of providing a sample of pyruvic acid in a state favorable to rapid attainment of high spin polarization, the method comprising:
    cooling a sample of pyruvic acid from a temperature above a freezing point of the sample of pyruvic acid down to less than about 200 Kelvin to provide the sample,
    where the step of cooling is performed in the absence of an adulterant material.

25. A method of providing a hyperpolarized sample of pyruvic acid in a state favorable to rapid attainment of high spin polarization, the method comprising:
    cooling a sample of pyruvic acid at a rate of at least about one Kelvin per minute from a temperature above a freezing point of the sample of pyruvic acid down to about 265 Kelvin;
    maintaining the sample at about 265 Kelvin for a period of time; and
    reducing temperature of the sample of pyruvic acid to about 200 Kelvin.

26. The method of claim 25, wherein the period of time is about 1-2 hours.

27. The method of claim 25, wherein the period of time is greater than about 15 minutes.

28. A method of providing a material sample in a state favorable to retaining spin polarization, the method comprising:
cooling a material sample at a rate of at least about one Kelvin per minute from a temperature above a freezing point of the sample of pyruvic acid down to about 265 Kelvin;
maintaining the sample at about 265 Kelvin for a period of time; and
reducing temperature of the sample of the sample material acid to about 200 Kelvin,
wherein the steps of cooling, maintaining and reducing are performed in the absence of an adulterant material.

29. The method of claim 28, wherein the sample is selected from one of pyruvic acid, acetic acid, one or more methyl groups and/or a carboxylic acid group and the time is about 1-2 hours.

30. The method of claim 28, wherein the sample is selected from one of pyruvic acid, acetic acid, or a molecule containing one or more methyl groups and/or a carboxylic acid group and the period of time of maintaining is greater than about 15 minutes and less than about 48 hours.

31. A method of providing a material sample in a state favorable to rapid attainment of high spin polarization, the method comprising:
providing a material sample in the annealed form;
at a temperature less than about 200 K warming the sample to a temperature of about 265 Kelvin;
maintaining the sample at about 265 Kelvin for a period of about 1 to 4 hours; and
reducing temperature of the sample to about 200 Kelvin.

32. The method of claim 31, where the step of reducing is performed at a rate of at least about 0.3 Kelvin per minute.

33. The method of claim 31, where the step of reducing is perfoinied at a rate of at least about 1.0 Kelvin per minute.

34. The method of claim 31, wherein the sample is selected from one of pyruvic acid, acetic acid, or a molecule containing one or more methyl groups and/or a carboxylic acid group.

35. The method of claim 31, wherein the sample is isotopically enhanced by substituting one or more of its atomic sites with at least one of 129Xe, 13C, 15N, 1H, 2H, 31P, 19F and 29Si.

* * * * *

UNITED STATES PATENT AND TRADEMARK OFFICE
CERTIFICATE OF CORRECTION

PATENT NO. : 9,606,200 B2  
APPLICATION NO. : 14/161172  
DATED : March 28, 2017  
INVENTOR(S) : Kempf et al.

Page 1 of 1

It is certified that error appears in the above-identified patent and that said Letters Patent is hereby corrected as shown below:

In the Claims

Column 14  
Line 14, please delete "perfoinied" and insert -- performed --

Signed and Sealed this  
Thirtieth Day of May, 2017

Michelle K. Lee  
*Director of the United States Patent and Trademark Office*